437/43

United States Patent [19]

Mori

[11] Patent Number: 4,935,378
[45] Date of Patent: Jun. 19, 1990

[54] METHOD FOR MANUFACTURING A SEMICONDUCTOR DEVICE HAVING MORE THAN TWO CONDUCTIVE LAYERS

[75] Inventor: Seiichi Mori, Tokyo, Japan

[73] Assignee: Kabushiki Kaisha Toshiba, Kawasaki, Japan

[21] Appl. No.: 170,253

[22] Filed: Mar. 18, 1988

[30] Foreign Application Priority Data

Mar. 23, 1987 [JP] Japan ................... 62-68255

[51] Int. Cl.$^5$ .................. H01L 27/10; H01L 29/78
[52] U.S. Cl. ..................... 437/43; 437/52; 437/195
[58] Field of Search ............... 437/43, 52, 195, 200; 357/23.5

[56] References Cited

U.S. PATENT DOCUMENTS

| 4,288,256 | 9/1981 | Ning et al. ............... 357/59 |
| 4,519,849 | 5/1985 | Korsh et al. .............. 437/43 |
| 4,663,645 | 5/1987 | Komori et al. ........... 357/23.5 |
| 4,697,330 | 10/1987 | Paterson et al. ........... 437/42 |
| 4,701,776 | 10/1987 | Perlegos et al. .......... 357/23.5 |
| 4,768,080 | 8/1988 | Sato ....................... 357/54 |

FOREIGN PATENT DOCUMENTS 0123726 11/1984 European Pat. Off. .
0200364 11/1986 European Pat. Off. .
0158970 9/1983 Japan ..................... 437/43

Primary Examiner—Olik Chaudhuri
Attorney, Agent, or Firm—Finnegan, Henderson, Farabow, Garrett and Dunner

[57] ABSTRACT

According to a semiconductor device manufacturing method of the invention, a first polycrystalline silicon layer doped with an impurity, a thin oxide film, a second polycrystalline silicon layer, and a silicon nitride film are sequentially formed, one upon the other. The silicon nitride film, the second polycrystalline silicon layer, the thin oxide film, and the first polycrystalline silicon layer are then etched, in a self-aligned manner, by means of a photolithography process. A thick oxide film is formed on a side wall portion of the first polycrystalline silicon layer, using the silicon nitride film as a mask, and after the silicon nitride film is removed, a conductive film is formed on the entire surface. Since a film formation process advances without patterning the first polycrystalline silicon layer, the first polycrystalline silicon layer is not damaged by an RIE process and the like. A defect density of the oxide film formed on the first polycrystalline silicon layer can be reduced. Since the thick oxide film is formed on the side wall portion of the first polycrystalline silicon layer, a withstand voltage and reliability of this portion are largely improved.

9 Claims, 3 Drawing Sheets

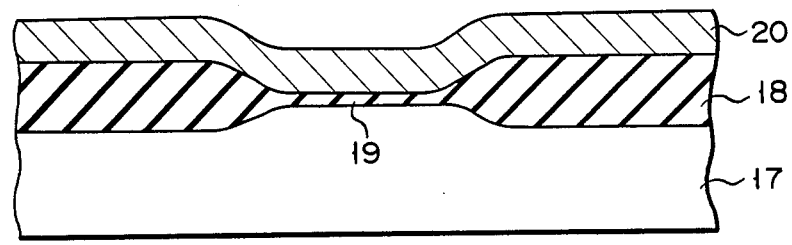
F I G. 3A
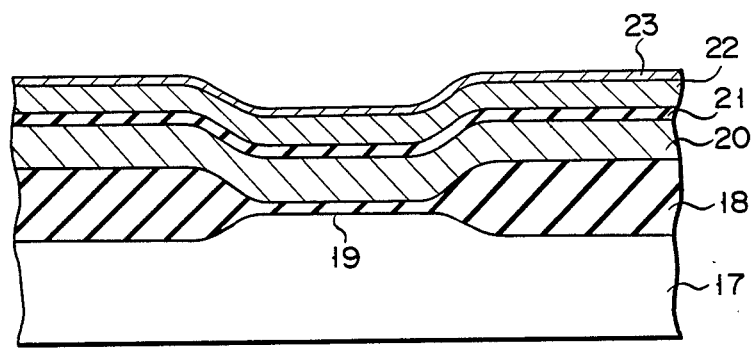
F I G. 3B
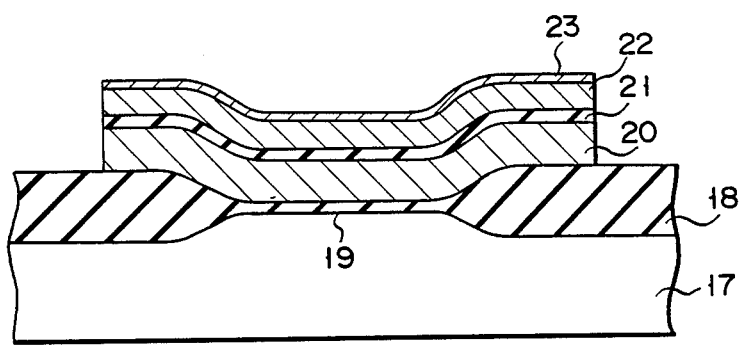
F I G. 3C

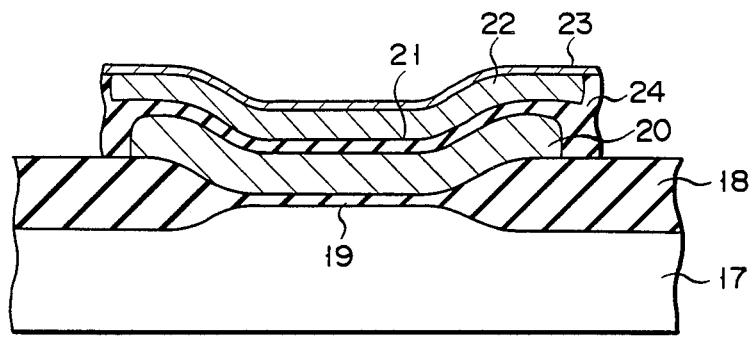
F I G. 3D
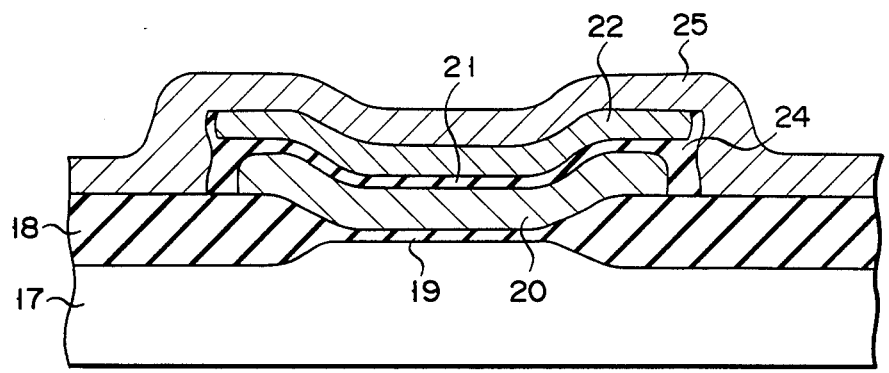
F I G. 3E 4,935,378

METHOD FOR MANUFACTURING A SEMICONDUCTOR DEVICE HAVING MORE THAN TWO CONDUCTIVE LAYERS

BACKGROUND OF THE INVENTION

1. Field of the Invention

The present invention relates to a method of manufacturing a semiconductor device which generally necessitates the use of two or more polycrystalline silicon layers and which requires there to be a large capacitive coupling between the polycrystalline silicon layers and, more particularly, to a method of manufacturing a semiconductor memory device such as an EPROM, an EEPROM, and a DRAM.

2. Description of the Related Art

Conventionally, EPROMs (or EEPROMs) are manufactured by forming a thin insulating film between two polycrystalline silicon layers; that is, after a first polycrystalline silicon layer is formed, an impurity such as phosphorus is doped therein. Subsequently, a desired region of the first polycrystalline silicon layer is selectively removed by way of photolithography and RIE processes, and the surface of the first polycrystalline silicon layer is thermally oxidized to form a thin oxide film. Thereafter, a second polycrystalline silicon layer is formed and patterned.

FIG. 1 shows a sectional structure of an EPROM (or an EEPROM) formed by use of the above conventional manufacturing method. In FIG. 1, reference numeral 11 denotes a silicon substrate; 12, an element isolation region; 13, a gate insulating film; 14, a first polycrystalline silicon layer; 15, a thin insulating film (oxide film); and 16, a second polycrystalline silicon layer. Although not shown, source and drain regions are formed in front of and behind the structure.

Recently, scaling down is required for semiconductor device. In order to satisfy this requirement dimensions, if thickness of insulating film 15 is designed to be thin, and film 15 is formed at a low temperature so as to prevent expansion of a diffusion layer formed in substrate 11, the following problems are posed. That is, as shown in FIG. 2, region A encircled within a broken line in FIG. 1 is illustrated in an enlarged scale, only insulating films 15a and 15b which are thinner than a flat portion are formed at corner portions of layer 14. For this reason, an effective withstand voltage of the element is reduced. Moreover, when thinner film 15 is formed at a low temperature, edge portions 14a and 14b of layer 14 are not rounded, with the result that field enhancement tends to occur thereat. Field enhancement also causes a reduction in the element electric field strength. In addition, side wall portion 14c of layer 14 is damaged or contaminated by the RIE process performed when layer 14 is patterned. As a result, vertical portion 15c of film 15 formed on side wall portion 14c, generally has tends to have many defects. These defects reduce the manufacturing yield of the device. Furthermore, since the conventional manufacturing method requires that a photoresist be used in the patterning of layer 14, prior to the formation of insulating film 15, this results in the surface of layer 14 being contaminated. As a result of this contamination, whole number of defects generated in film 15 is increased or movable ions are trapped therein, thereby destabilizing the element characteristics and degrading the reliability of the element.

SUMMARY OF THE INVENTION

It is, therefore, an object of the present invention to provide a method of manufacturing a semiconductor device in which a reduction in electric field strength of a formed element can be prevented and characteristics of the element can be stabilized, thereby improving the manufacturing yield and reliability.

In the present invention, after a first silicon layer doped with an impurity is formed, a thin insulating film, a second silicon layer, and an antioxidant film are sequentially formed without patterning the first silicon layer. Then, photolithography is performed to etch the antioxidant film, the second silicon layer, the thin insulating film, and the first silicon layer in a self-alignment method. Thereafter, a thick oxide film is formed on a side wall portion of the first silicon layer using the antioxidant film as a mask. A conductive layer is formed on the entire surface to be electrically connected to the second silicon layer.

In the above manufacturing method, after the first silicon layer is formed, the thin insulating film, the second silicon layer, and the antioxidant film are formed without patterning the first silicon layer. That is, a resist is not applied on the first silicon layer. Therefore, the whole number of defects generated in the thin insulating film due to contamination caused by the resist can be reduced, and variations in element characteristics produced because movable ions are guided in the thin insulating film can be prevented, thereby improving reliability of the element. In addition, the thick oxide film can be formed on the side wall portion of the first silicon layer. Therefore, the defect density of the oxide film and a reduction in electric field strength due to field enhancement can be reduced at this portion, thereby largely improving the manufacturing yield and reliability of the element.

BRIEF DESCRIPTION OF THE DRAWINGS

FIGS. 3A to 3E are sectional views each showing one of the processes involved in the method of manufacturing a semiconductor device according to the present invention, in which FIG. 3A is a view in which an element isolation region is formed on a silicon substrate, a first insulating film is formed, and a first polycrystalline silicon layer doped with phosphorus is formed on the entire surface, FIG. 3B is a view in which the surface of the first polycrystalline silicon layer is oxidized to form a second insulating film, a second polycrystalline silicon layer is formed, and subsequently a silicon nitride film is formed, FIG. 3C is a view in which the silicon nitride film, the second polycrystalline silicon layer, the second insulating film, and the first polycrystalline silicon layer are selectively etched by an RIE method in a self-alignment method, FIG. 3D is a view in which a third insulating film is formed at side portions of the first and second polycrystalline silicon layers, and FIG. 3E is a view in which the silicon nitride film is removed, a third polycrystalline silicon layer is formed on the entire surface, and phosphorus is diffused in the third polycrystalline silicon layer.

DETAILED DESCRIPTION OF THE PREFERRED EMBODIMENT

Figure 1:
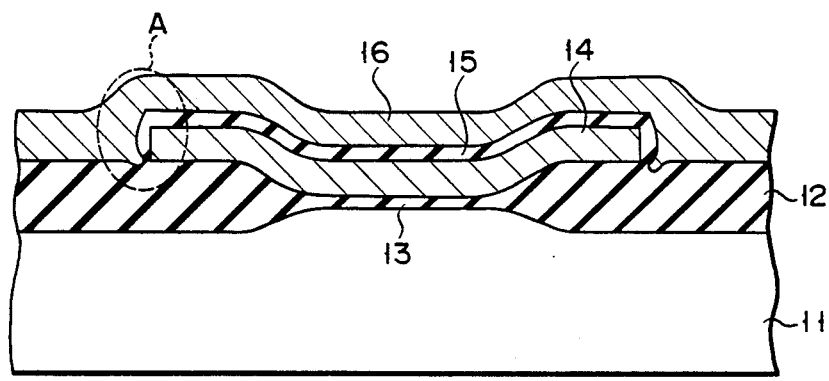
FIG. 1 is a sectional view of an EPROM or EEPROM formed by use of a conventional manufacturing method.
Figure 2:
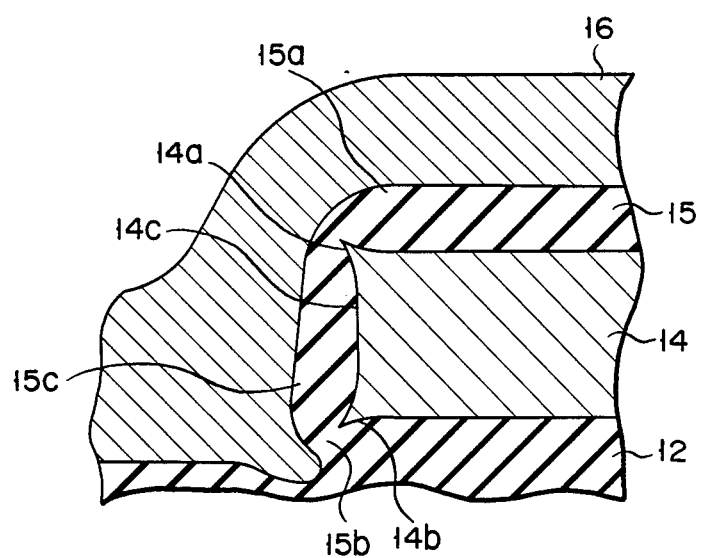
FIG. 2 is an enlarged sectional view of region A shown in FIG. 1.

An embodiment of the semiconductor device manufacturing method according to present invention will now be described below, with reference to FIGS. 3A to 3E. Each of these figures shows a step involved in the manufacture of an EPROM (or an EEPROM).

First, as is shown in FIG. 3A, a main surface of silicon substrate 17 is selectively oxidized by use of, for example, the LOCOS method, to form element isolation region 18. Next, the surface of an element region formed in silicon substrate 17 which is isolated by region 18 is thermally oxidized at a temperature of 800° C. to 900° C., in an oxygen atmosphere to form gate oxide film (first insulating film) 19. Thereafter, 4,000-Å thick first polycrystalline silicon layer 20 is formed on the entire surface of film 19, by use of the LPCVD method, and phosphorus having a concentration of about $2 \times 10^{20}$ cm$^{-3}$ is diffused therein.

Subsequently, the surface of layer 20 is oxidized, by use of a dilution oxidation method, at a temperature of, for example, 1,000° C., to form 100- to 200-Å thick thin oxide film (second insulating film) 21 thereon, and 1,000-Å thick second polycrystalline silicon layer 22 is formed on film 21, by use of the LPCVD method. Then, 100-Å thick silicon nitride film (antioxidant film) 23 is formed on layer 22, again by use of the LPCVD method (FIG. 3B).

A mask (not shown) is then formed by photolithography, in order for film 23, layer 22, film 21, and layer 20 to be selectively etched in a self-alignment manner, by way of the RIE process. Subsequently, the photoresist used as the mask in the RIE process is removed, whereby the structure shown in FIG. 3C is obtained.

Thereafter, the resultant structure is selectively thermally oxidized, for about 20 minutes, at a temperature of, for example, 1,000° C., in a dry oxygen atmosphere, to form oxide film (third insulating film) 24 on the side wall portions of layers 20 and 22. Since, at this time, layer 20 contains a high concentration of phosphorus, oxidation of layer 20 occurs at an increased speed to form a thick oxide film as shown in FIG. 3D.

Film 23 is removed by use of the RIE, CDE, or wet etching method, after which third polycrystalline silicon layer (conductive layer) 25 is formed on the entire surface of isolation region 18, and layer 22 to diffuse phosphorus. Next, layers 22 and 25 are electrically connected to each other, which results in the structure shown in FIG. 3E. Thereafter, by performing predetermined patterning, ion implantation, and wiring, an EPROM or EEPROM is completed.

Since, according to the above manufacturing method, thick film 24 can be formed at the corner and side wall portions of layer 20, a reduction in the withstand voltage of memory can be prevented. Experiments carried out show that when only a thin insulating film is formed at an edge portion of the first polycrystalline silicon layer, as in the case of the conventional manufacturing method, this results in a two or three orders of magnitude larger leakage current at the edge portion than that of a flat portion. For example, when a capacitor has a size of 1 mm$^2$ and the edge is 1,000 mm long, a leakage current of $10^{-8}$ to $10^{-7}$ A flows upon application of an electric field of 9 MV/cm. However, according to the present invention, the leakage current can be reduced to $10^{-10}$ A. In addition, immediately after layer 20 is formed, film 21, layer 22, and film 23 are sequentially formed, one upon the other without the need for photolithography or etching to be performed. Therefore, since there is no resist coated on layer 20, whole number of defects of film 21 generated by contamination caused by the resist can be reduced, and variations in element characteristics produced because movable ions are trapped in film 21 can be prevented, thereby improving reliability.

Note that in the above embodiment, film 23, which serve as the antioxidant film is removed, after which layer 25 is formed. However, if a thin nitride film (having a film thickness of 50 Å or less) is formed by, e.g., plasma nitridation method, layers 22 and 25 are electrically connected to each other because a barrier height of ultra thin silicon nitride is low. In this case, the nitride film need not be removed. Moreover, if a high melting point metal, a silicide of a high melting metal, or a polycide of the silicide and polycrystalline silicon is used instead of layer 25, a resistance of a wiring layer can be reduced. Furthermore, in the above embodiment, each insulating film is formed by thermal oxidation. However, it is a matter of course that a multi-layered film of an insulating film formed by the CVD method and an insulating film formed by the CVD method can be used.

What is claimed is:

1. A method of manufacturing a semiconductor device, comprising the steps of:
   forming an element isolation region on a main surface of a silicon substrate;
   forming a first insulating film on an element region of said silicon substrate which is isolated by said element isolation region;
   forming a first silicon layer doped with an impurity on said entire first insulating film and extending over said element isolation region;
   forming a second insulating film on said first silicon layer and extending over said element isolation region;
   forming a second silicon layer on said second insulating film and extending over said element isolation region;
   forming an antioxidant film on said second silicon layer and extending over said element isolation region;
   selectively etching said antioxidant film, said second silicon layer, said second insulating film, and said first silicon layer using a mask having a predetermined pattern to terminate said first silicon layer at side wall portions thereof each extending perpendicularly onto said element isolation region;
   forming a third insulating film on said side wall portions of said first silicon layer and on side wall portions of said second silicon layer, by selective oxidation, using said antioxidant film as a mask; and
   forming a conductive layer on said second silicon layer and extending over said element isolation region with said conductive layer having a wall portion on said element isolation region facing said side wall portions of said first silicon layer, with said third insulating film being between said wall portion of said conductive layer and said side wall portions of said first silicon layer.

2. A method according to claim 1, wherein said antioxidant film is a silicon nitride film.

3. A method according to claim 1, wherein said conductive layer consists of silicon.

4. A method according to claim 1, wherein said conductive layer consists of a high melting point metal.

5. A method according to claim 1, wherein said conductive layer consists of a silicide of a high melting point metal.

6. A method according to claim 1, wherein said conductive layer consists of a polycide of a silicide of a high melting point metal and polycrystalline silicon.

7. A method according to claim 1, wherein said first and second insulating films are oxide films.

8. A method according to claim 1, wherein the impurity doped in said first silicon layer is phosphorus.

9. A method according to claim 1, wherein said antioxidant film is removed from said second silicon layer before said conductive layer is formed on said second silicon layer and said element isolation region.

* * * * *